United States Patent
Chung et al.

(10) Patent No.: US 12,362,189 B2
(45) Date of Patent: Jul. 15, 2025

(54) SEMICONDUCTOR DEVICES AND METHODS OF MANUFACTURING THEREOF

(71) Applicant: Taiwan Semiconductor Manufacturing Co., Ltd., Hsinchu (TW)

(72) Inventors: Chia-Ling Chung, Hsinchu (TW); Chun-Chih Cheng, Changhua County (TW); Shun-Wu Lin, Taichung (TW); Ming-Hsi Yeh, Hsinchu (TW); Kuo-Bin Huang, Jhubei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 18/232,546

(22) Filed: Aug. 10, 2023

(65) Prior Publication Data
US 2024/0014043 A1    Jan. 11, 2024

Related U.S. Application Data

(62) Division of application No. 17/460,085, filed on Aug. 27, 2021, now Pat. No. 11,854,816.

(51) Int. Cl.
*H01L 21/306* (2006.01)
*H01L 21/762* (2006.01)
*H10D 30/67* (2025.01)
*H10D 64/01* (2025.01)

(52) U.S. Cl.
CPC .... *H01L 21/30604* (2013.01); *H01L 21/7624* (2013.01); *H10D 64/01* (2025.01); *H10D 30/6729* (2025.01)

(58) Field of Classification Search
CPC .......... H01L 21/30604; H01L 21/7624; H01L 21/30608; H10D 30/014; H10D 30/0198; H10D 30/43; H10D 30/6735; H10D 30/6757; H10D 62/822; H10D 62/121; H10D 64/251
See application file for complete search history.

(56) References Cited

U.S. PATENT DOCUMENTS

| | | | |
|---|---|---|---|
| 6,391,731 B1 * | 5/2002 | Chong | H01L 29/6659 257/E21.336 |
| 7,785,939 B2 | 8/2010 | De Souza et al. | |
| 9,875,939 B1 | 1/2018 | Ke et al. | |
| 2005/0116290 A1 | 6/2005 | De Souza et al. | |

(Continued)

*Primary Examiner* — Dao H Nguyen
(74) *Attorney, Agent, or Firm* — FOLEY & LARDNER LLP

(57) ABSTRACT

A method of fabricating a semiconductor device is described. A substrate is provided. A first semiconductor region of a first semiconductor material is formed over the substrate and adjacent a second semiconductor region of a second semiconductor material. The first and second semiconductor regions are crystalline. An etchant is selective to etch the first semiconductor region over the second semiconductor region. The entire first semiconductor region is implanted to form an amorphized semiconductor region. The amorphized semiconductor region is etched with the etchant using the second semiconductor region as a mask to remove the amorphized semiconductor region without removing the second semiconductor region.

20 Claims, 21 Drawing Sheets

(56) References Cited

U.S. PATENT DOCUMENTS

| | | | |
|---|---|---|---|
| 2014/0264347 A1* | 9/2014 | Sassiat | H01L 21/26506 438/156 |
| 2015/0126041 A1* | 5/2015 | Chatterjee | H01L 21/31144 438/719 |
| 2015/0340488 A1 | 11/2015 | Leobandung et al. | |
| 2016/0079128 A1 | 3/2016 | Loubet et al. | |
| 2017/0358459 A1* | 12/2017 | Reboh | H01L 21/0337 |
| 2020/0335601 A1* | 10/2020 | Liu | H01L 21/02255 |
| 2022/0115262 A1 | 4/2022 | Rana et al. | |
| 2024/0006489 A1* | 1/2024 | Lilak | H01L 21/823871 |

\* cited by examiner

SEMICONDUCTOR DEVICES AND METHODS OF MANUFACTURING THEREOF

CROSS-REFERENCE TO RELATED APPLICATIONS

This present application is a Divisional of Ser. No. 17/460,085, filed Aug. 27, 2021, the entire disclosure of which is incorporated herein by reference.

BACKGROUND

This disclosure relates generally to a semiconductor device, and in some embodiments, to methods of wet etching and corresponding semiconductor devices.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
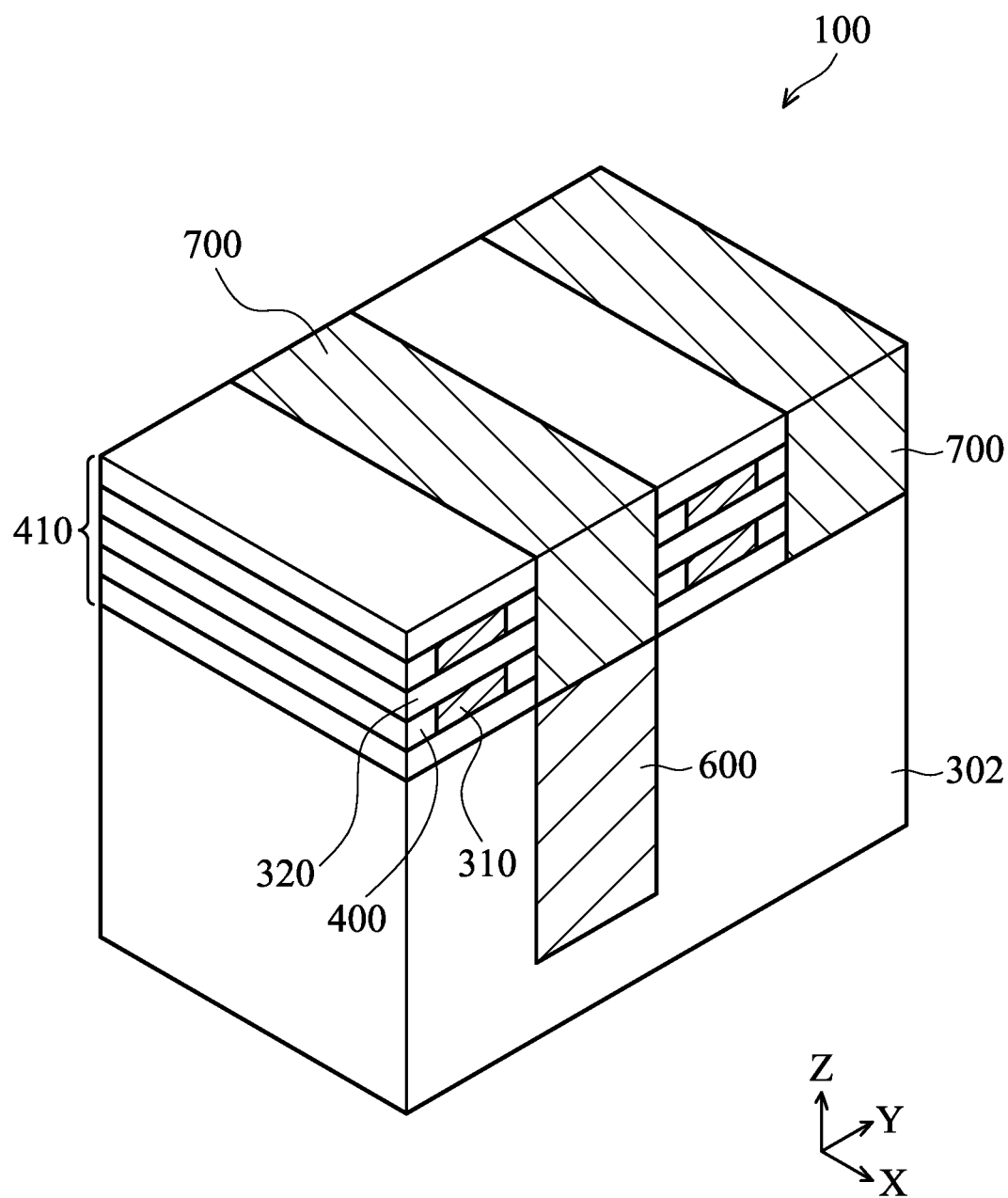
FIG. 1 is a perspective view illustrating a semiconductor device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as field effect transistors ("FETs"), are fabricated on a single wafer. Non-planar transistor device architectures, such as fin-based transistors (typically referred to as "FinFETs"), can provide increased device density and increased performance over planar transistors. Some advanced non-planar transistor device architectures, such as nanosheet (or nanowire) transistors, can further increase the performance over the FinFETs. When compared to the FinFET where the channel is partially wrapped (e.g., straddled) by a gate structure, the nanosheet transistor, in general, includes a gate structure that wraps around the full perimeter of one or more nanosheets for improved control of channel current flow. For example, in a FinFET and a nanosheet transistor with similar dimensions, the nanosheet transistor can present larger driving current ($I_{on}$), smaller subthreshold leakage current ($I_{off}$), etc. Such a transistor that has a gate structure fully wrapping around its channel is typically referred to as a gate-all-around (GAA) transistor or GAAFET.

The present disclosure provides various embodiments of a semiconductor device, which may include a FinFET, GAAFET, or nanosheet FET (NSFET) transistor. Embodiments of the present disclosure are discussed in the context of forming a non-planar transistor, such as a FinFET, GAAFET, or NSFET transistor, and in particular, in the context of a semiconductor device. A particular example is a GAAFET semiconductor device. The semiconductor device may be formed by a method. A substrate is provided. A first semiconductor region of a first semiconductor material is formed over the substrate adjacent a second semiconductor region of a second semiconductor material. The first and second semiconductor regions are crystalline. An etchant is selective to etch the first semiconductor region over the second semiconductor region. The first semiconductor region is implanted to form an amorphized semiconductor region. The amorphized semiconductor region is etched with the etchant to remove the amorphized semiconductor region.

A method of fabrication of a semiconductor device as described can provide advantages. Implanting a first semiconductor region adjacent a second semiconductor region can improve the etch rate of the first semiconductor region relative to the second semiconductor region. Further, the selectivity of etching the first semiconductor region relative to the second semiconductor region can be improved. The implanting amorphizes the first semiconductor region originally having a crystalline structure to increase the etch rate and selectivity. An example of the first semiconductor region is crystalline silicon, and an example of the second semiconductor region is crystalline silicon germanium. The implantation allows for an inexpensive alkaline solution to be used as etchant for the silicon/silicon germanium system.

FIG. 1 is a perspective view illustrating the semiconductor device showing the cross-sectional cuts in the Y direction. FIG. 1 illustrates the device 100, which may be a GAAFET, with source/drain (S/D) structures 700, inner spacers 400, fins 410, a number of first semiconductor layers 310, a number of second semiconductor layers 320, and substrate 302.

Figure 2:
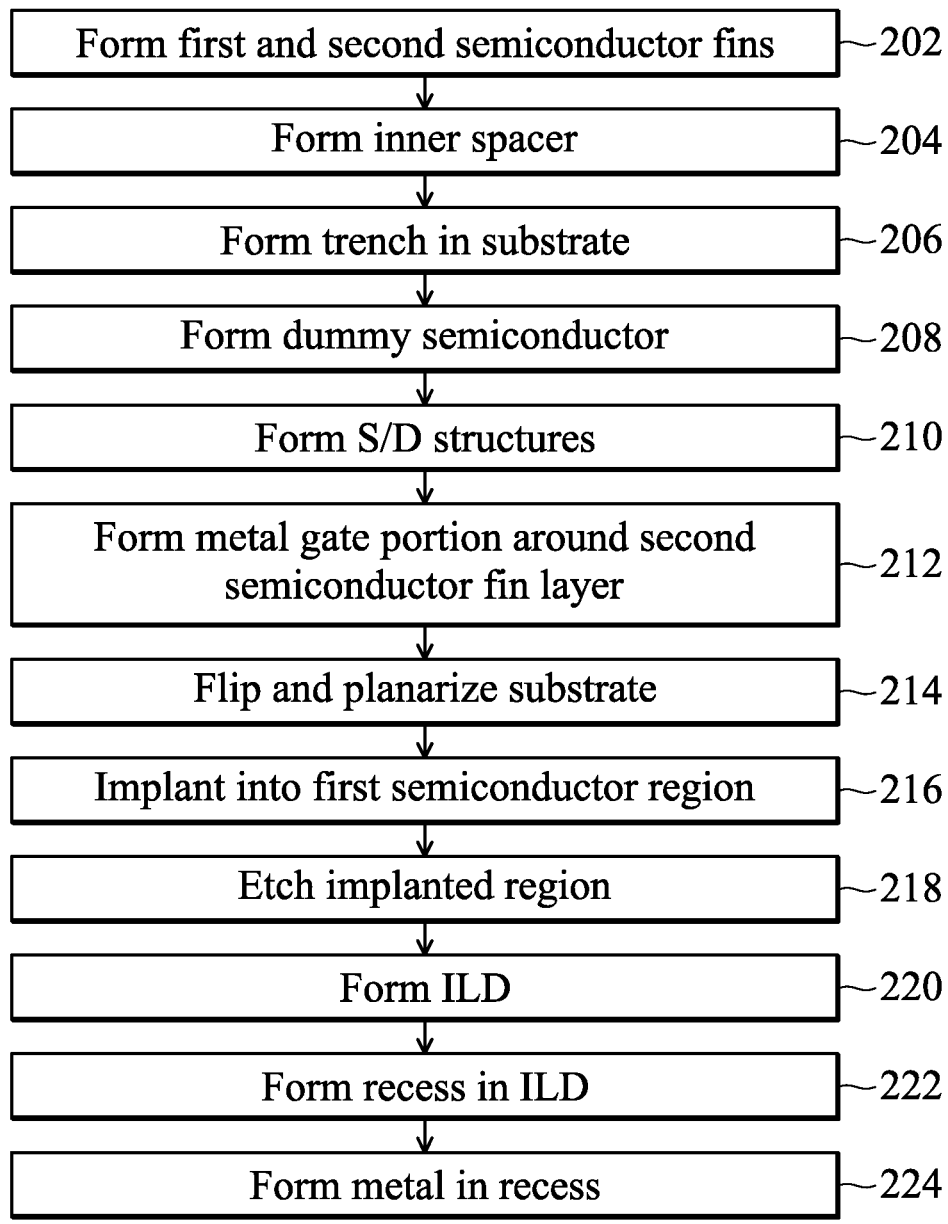
FIG. 2 illustrates a flow chart of an example method to make a semiconductor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a GAAFET (or a FinFET) transistor device. Further, the method 200 can be used to form a GAAFET transistor (or FinFET transistor) device in a respective conduction type such as, for example, an n-type transistor device or a p-type transistor device. The term "n-type," as used herein, may be referred to as the conduction type of a transistor having electrons as its conduction carriers, and the term "p-type," as used herein, may be referred to as the conduction type of a transistor having holes as its conduction carriers.

FIG. 2 illustrates a flowchart of a method 200 to form a semiconductor device according to one or more embodiments of the present disclosure. It is noted that the method 200 is merely an example, and is not intended to limit the present disclosure.

Referring to FIG. 2, the method 200 starts with operation 202 in which first and second semiconductor layers are patterned. The method 200 continues to operation 204 in which inner spacers are formed. The method 200 continues to operation 206 in which trenches are formed in the substrate between fins. The method 200 continues to operation 208 in which a dummy semiconductor is formed in the trench. The method 200 continues to operation 210 in which S/D structures are formed. The method 200 continues to operation 212 in which a gate portion of metal is formed around the second semiconductor layers. The method 200 continues to operation 214 in which the substrate is flipped and planarization is performed. The method 200 continues to operation 216 in which an implant of the first semiconductor region adjacent the dummy semiconductor is performed. The method 200 continues to operation 218 in which etching is performed to remove an implanted amorphized region. The method 200 continues to operation 220 in which and interlevel dielectric (ILD) and CESL is formed. The method 200 continues to operation 222 in which a recess is formed in the ILD exposing the source structure. The method 200 continues to operation 224 in which a metal is formed in the recess.

In the following discussions, the operations of the method 200 may be associated with views of a semiconductor device 100 at various fabrication stages. In some embodiments, the semiconductor device 100 may be GAAFET or nanosheet FET (NSFET).

Figure 3:
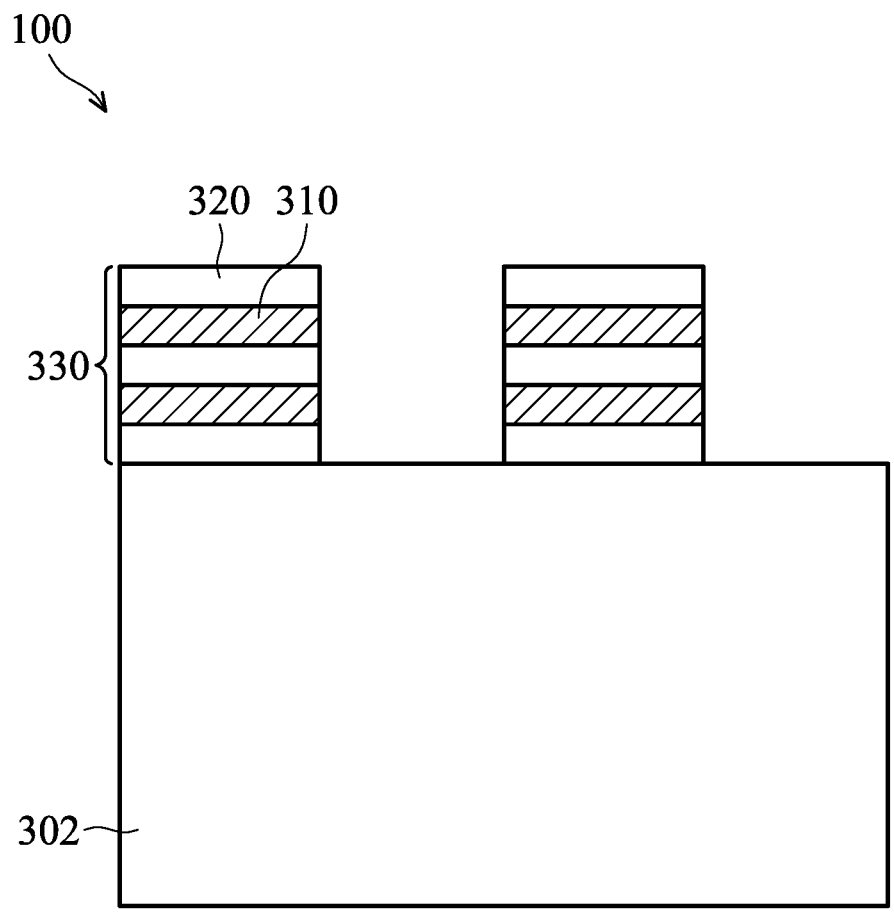
FIGS. 3-14 illustrate cross-sectional views cut along a Y direction of FIG. 1 during various fabrication stages in accordance with some embodiments.

Corresponding to operation 202 of FIG. 2, FIG. 3 is a view of the semiconductor device 100 including forming patterned first and second semiconductor layers at one of the various stages of fabrication, according to some embodiments.

The semiconductor device 100 includes a number of first semiconductor layers 310 and a number of second semiconductor layers 320 formed on a provided semiconductor substrate 302 at one of the various stages of fabrication, where the first semiconductor layers 310 function as sacrificial layers, as described below. The semiconductor layers 310 and 320 together comprise a semiconductor layer 330. In some embodiments the transistor device may be other than a GAA transistor device, and the layer 330 may be formed of a single semiconductor material.

The semiconductor substrate 302 includes a semiconductor material substrate, for example, silicon. Alternatively, the semiconductor substrate 302 may include other elementary semiconductor material such as, for example, germanium. The semiconductor substrate 302 may also include a compound semiconductor such as silicon carbide, gallium arsenide, indium arsenide, and indium phosphide. The semiconductor substrate 302 may include an alloy semiconductor such as silicon germanium, silicon germanium carbide, gallium arsenic phosphide, and gallium indium phosphide. In one embodiment, the semiconductor substrate 302 includes an epitaxial layer. For example, the semiconductor substrate 302 may have an epitaxial layer overlying a bulk semiconductor. Furthermore, the semiconductor substrate 302 may include a semiconductor-on-insulator (SOI) structure. For example, the semiconductor substrate 302 may include a buried oxide (BOX) layer formed by a process such as separation by implanted oxygen (SIMOX) or other suitable technique, such as wafer bonding and grinding.

The first semiconductor layers 310 and the second semiconductor layers 320 are alternatingly disposed on top of one another (e.g., along the Z direction) to form a stack. For example, one of the second semiconductor layers 320 is disposed over one of the first semiconductor layers 310 then another one of the first semiconductor layers 320 is disposed over the second semiconductor layer 310, so on and so forth.

The stack may include any number of alternately disposed semiconductor layers 310 and 320. The semiconductor layers 310 and 320 may have different thicknesses. The first semiconductor layers 310 may have different thicknesses from one layer to another layer. The second semiconductor layers 320 may have different thicknesses from one layer to another layer. The thickness of each of the semiconductor layers 310 and 320 may range from a few nanometers to a few tens of nanometers. The first layer of the stack may be thicker than other semiconductor layers 310 and 320. In an embodiment, each of the first semiconductor layers 310 has a thickness ranging from about 5 nanometers (nm) to about 20 nm, and each of the second semiconductor layers 320 has a thickness ranging from about 5 nm to about 20 nm.

The two semiconductor layers 310 and 320 have different compositions. In various embodiments, the two semiconductor layers 310 and 320 have compositions that provide for different oxidation rates and/or different etch selectivity between the layers. In an embodiment, the first semiconductor layers 310 include silicon germanium ($Si_{1-x}Ge_x$), and the second semiconductor layers 320 include silicon (Si). In an embodiment, each of the second semiconductor layers 320 is silicon that may be undoped or substantially dopant-free (i.e., having an extrinsic dopant concentration from about 0 cm$^{-3}$ to about 1×10$^{17}$ cm$^{-3}$), where for example, no intentional doping is performed when forming the layers 320 (e.g., of silicon).

In various embodiments, the second semiconductor layers 320 may be intentionally doped. For example, when the GAA transistor device 100 is configured in n-type (and operates in an enhancement mode), each of the second semiconductor layers 320 may be silicon that is doped with a p-type dopant such as boron (B), aluminum (Al), indium (In), and gallium (Ga); and when the GAA transistor device 100 is configured in p-type (and operates in an enhancement mode), each of the second semiconductor layers 320 may be silicon that is doped with an n-type dopant such as phosphorus (P), arsenic (As), antimony (Sb). In another example, when the GAA transistor device 100 is configured in n-type (and operates in a depletion mode), each of the second semiconductor layers 320 may be silicon that is doped with an n-type dopant instead; and when the GAA transistor device 100 is configured in p-type (and operates in a depletion mode), each of the second semiconductor layers 320 may be silicon that is doped with a p-type dopant instead. In some embodiments, each of the first semiconductor layers 310 is $Si_{1-x}Ge_x$ that includes less than 50% (x<0.5) Ge in molar ratio. For example, Ge may comprise about 15% to 35% of the semiconductor layers of $Si_{1-x}Ge_x$ in molar ratio. Furthermore, the first semiconductor layers 310 may include different compositions among them, and the second semiconductor layers 320 may include different compositions among them.

Either of the semiconductor layers 310 and 320 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 310 and 320 may be chosen based on providing differing oxidation rates and/or etch selectivity.

The semiconductor layers 310 and 320 can be epitaxially grown from the semiconductor substrate 302. For example, each of the semiconductor layers 310 and 320 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 extends upwardly, resulting in the semiconductor layers 310 and 320 having the same crystal orientation with the semiconductor substrate 302. After forming the semiconductor layers 310 and 320, they may be patterned to form a stack, for example, by a photolithographic process of forming a photoresist etch mask and etching the semiconductor layers 310 and 320 using an appropriate etchant.

Figure 4:
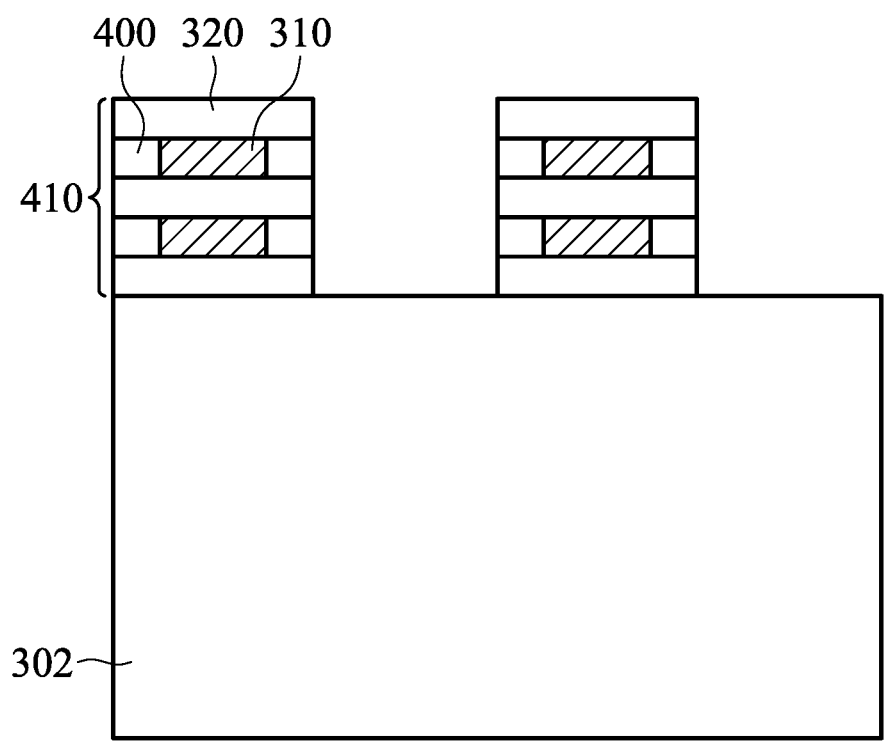

Corresponding to operation 204 of FIG. 2, FIG. 4 is a cross-sectional view of the GAA transistor device 100 with inner spacers 400.

Once an upper portion of the stack of the first semiconductor layers 310 and the second semiconductor layers 320 are exposed, the stack of the first semiconductor layers 310 and the second semiconductor layers 320 is patterned by an etch to form fins 410 with inner spacers 400. For example, the etch may be reactive ion etch (RIE), neutral beam etch (NBE), the like, or combinations thereof. The etch may be anisotropic.

Once the first semiconductor layers 310 and the second semiconductor layers 320 are patterned, the inner spacers 400 are formed laterally adjacent to the first semiconductor layers 310, which layers 310 are sacrificial layers as described later. End portions of the semiconductor layers 310 can be removed (e.g., etched) using a "pull-back" process to shorten the first semiconductor layers 310. It is understood that the pull-back distance (i.e., the extent to which each of the semiconductor layers 310 is etched, or pulled-back) can be arbitrarily increased or decreased. In an example where the semiconductor layers 320 include Si, and the semiconductor layers 310 include $Si_{1-x}Ge_x$, the pull-back process may include a hydrogen chloride (HCl) gas isotropic etch process, which etches SiGe without attacking Si. As such, the second semiconductor layers 320 may remain substantially intact during this process.

The inner spacers 400 can be formed by conformal deposition by chemical vapor deposition (CVD), or by monolayer doping (MLD) of nitride followed by spacer RIE. The inner spacers 400 can be deposited using, e.g., a conformal deposition process and subsequent isotropic or anisotropic etch back to remove excess spacer material on the sidewalls of the fins 410 and on a surface of the semiconductor substrate 302. A material of the inner spacers 400 can be, for example, formed of silicon nitride, silicoboron carbonitride, silicon carbonitride, silicon carbon oxynitride, or any other type of dielectric material (e.g., a dielectric material having a dielectric constant less than about 5) appropriate to the role of forming an insulating gate sidewall spacers of transistors.

Figure 5:
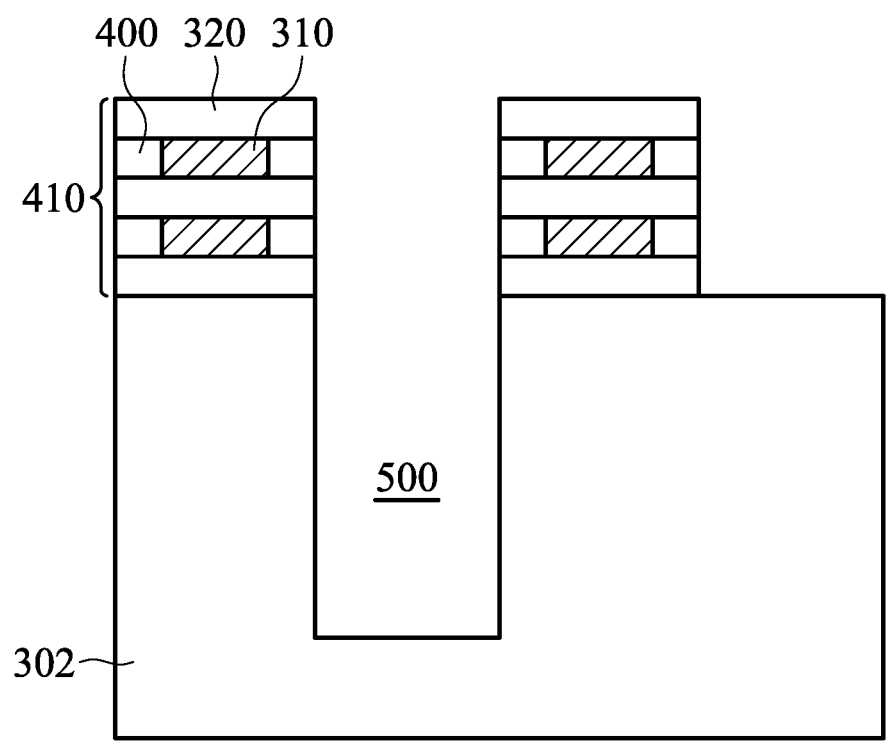

Corresponding to operation 206 of FIG. 2, FIG. 5 is a cross-sectional view of the GAA transistor device 100 with a trench 500 formed in the semiconductor substrate 302 between the fins 410. The trench 500 may be formed in the substrate 302 by photolithography, for example. A mask may be formed over the substrate to expose the region where the trench 500 is to be formed between the fins 410. The trench 500 may then be formed in the semiconductor substrate 302 using the mask as an etch mask. The etch may be an anisotropic etch, for example, such as RIE. The particular etchant used may be appropriate for the material of the semiconductor substrate 302.

Figure 6:
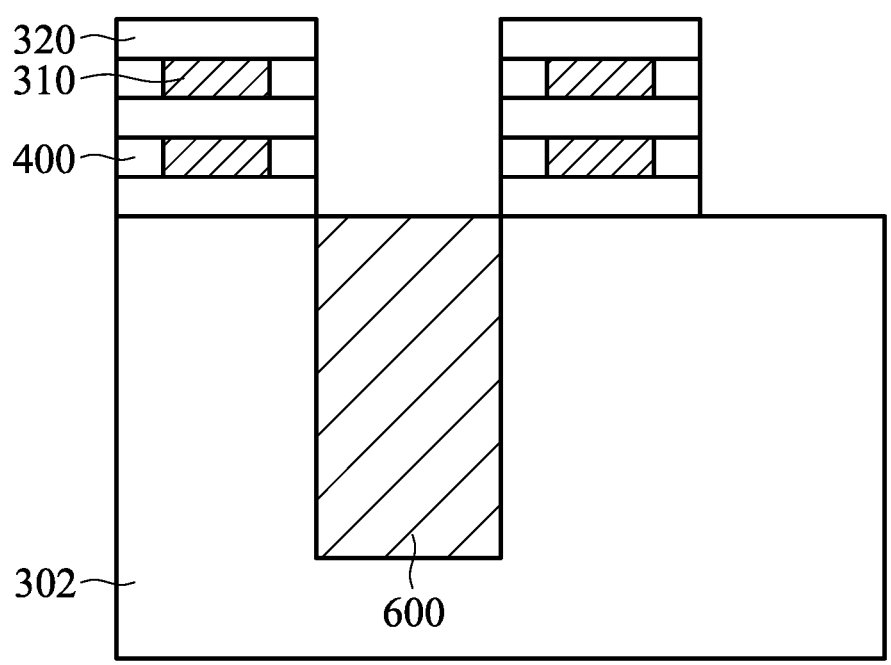

Corresponding to operation 208 of FIG. 2, FIG. 6 is a cross-sectional view of the GAA transistor device 100 with a dummy semiconductor 600 formed in the trench 500. The dummy semiconductor 600 (second semiconductor region) is formed of a semiconductor material (second semiconductor material) which is selective to being etched by an etchant over the semiconductor substrate 302 (first semiconductor region) formed of another semiconductor material (first semiconductor material), at least when the semiconductor substrate 302 has been made amorphous. Thus, the material of the dummy semiconductor 600 is chosen to have a lower etch rate than the semiconductor substrate 302 at least when the semiconductor substrate 302 has been made amorphous. The amorphization and etching an amorphized region are discussed further below. The The dummy semiconductor 600 may be formed of Si, Si—Ge, or Ge, for example, and may be formed by PVD or CVD, for example.

Figure 7:
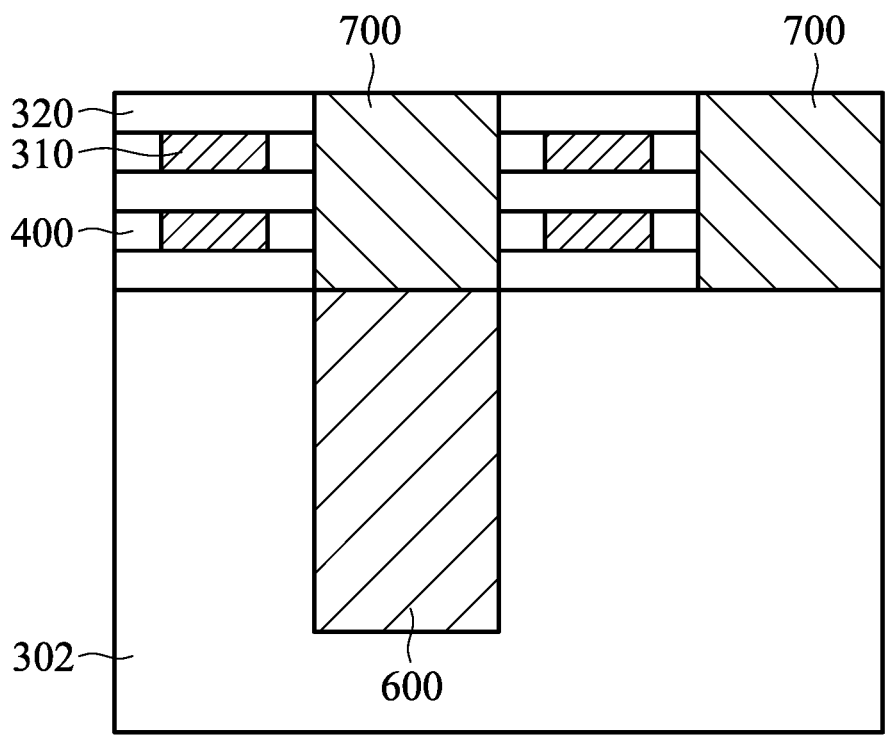

Corresponding to operation 210 of FIG. 2, FIG. 7 is a cross-sectional view of the GAA transistor device 100 with a S/D structure 700 formed between the fins 410. As shown in the illustrated example of FIG. 7, the S/D structures 700 are formed in the regions between the fins 410, which regions are formed when the fins 410 were formed. The S/D structures 700 are coupled to respective ends of each of the semiconductor layers 320 of the fins 410.

The S/D structures 700 may each include silicon germanium (SiGe), indium arsenide (InAs), indium gallium arsenide (InGaAs), indium antimonide (InSb), germanium arsenide (GaAs), germanium antimonide (GaSb), indium aluminum phosphide (InAlP), indium phosphide (InP), or combinations thereof. The source/drain structures 700 may be formed using an epitaxial layer growth process on exposed ends of each of the second semiconductor layers 320. For example, the growth process can include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epitaxial processes.

In-situ doping (ISD) may be applied to form doped S/D structures 700, thereby creating the junctions for the GAA transistor device 100. For example, when the GAA transistor device 100 is configured in n-type, the S/D structures 700 can be doped by implanting n-type dopants, e.g., arsenic (As), phosphorous (P), etc., into them. When the GAA transistor device 100 is configured in p-type, the S/D structures 700 can be doped by implanting p-type dopants, e.g., boron (B), etc., into them.

Figure 8:
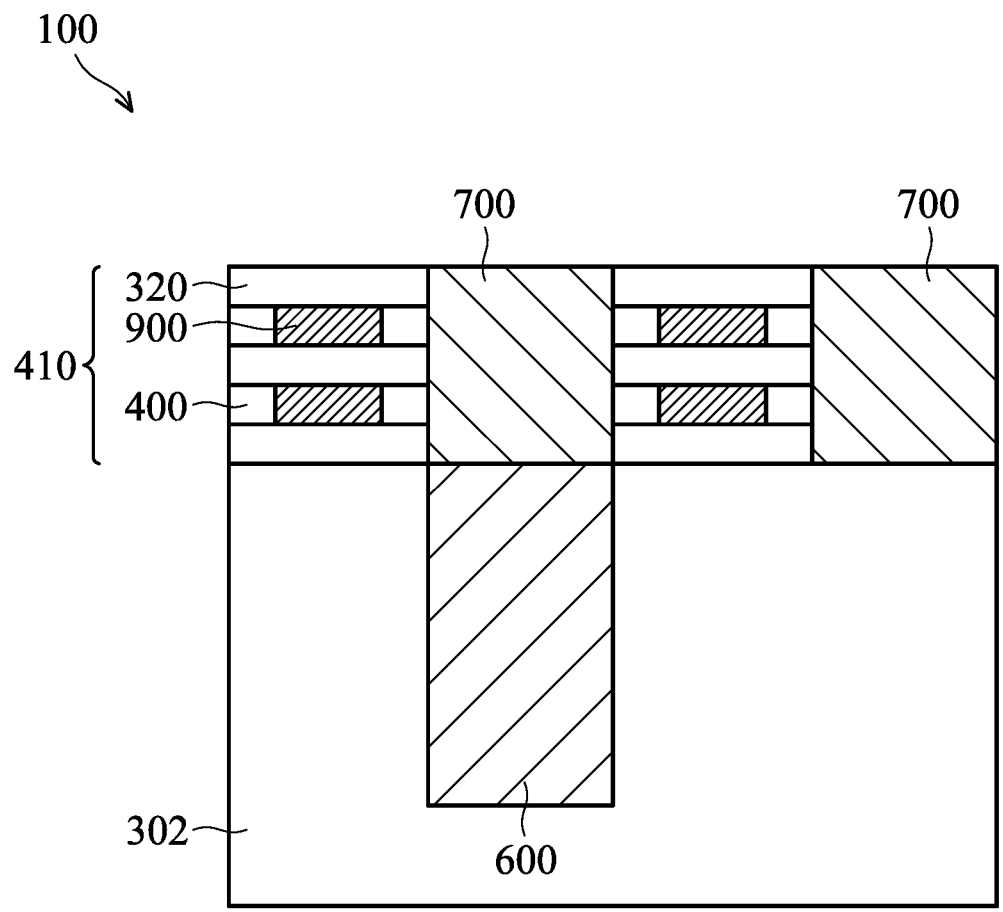

Corresponding to operation 212 of FIG. 2, FIG. 8 is a cross-sectional view of the GAA transistor device 100 where a gate portion 900 is formed in a region where the first semiconductor layers 310 are removed and a gate dielectric and gate metal (not shown for simplicity) are formed as the gate portion 900. The semiconductor layers 310 are removed by applying a selective etch (e.g., a hydrochloric acid (HCl)), while leaving the second semiconductor layers 320 substantially intact. After the removal of the first semiconductor layers 310, a respective bottom surface and top surface of each of the second semiconductor layers 320 may be exposed.

The gate portion 900 may wrap around the semiconductor layers 320. The gate portion 900 may include a gate dielectric (not shown for simplicity) and a gate metal (not shown for simplicity). The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer.

The gate metal can wrap around each of the semiconductor layers 320 with the gate dielectric disposed therebetween. The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The gate metal may also include metals such as Cu or W, for example.

Figure 9:
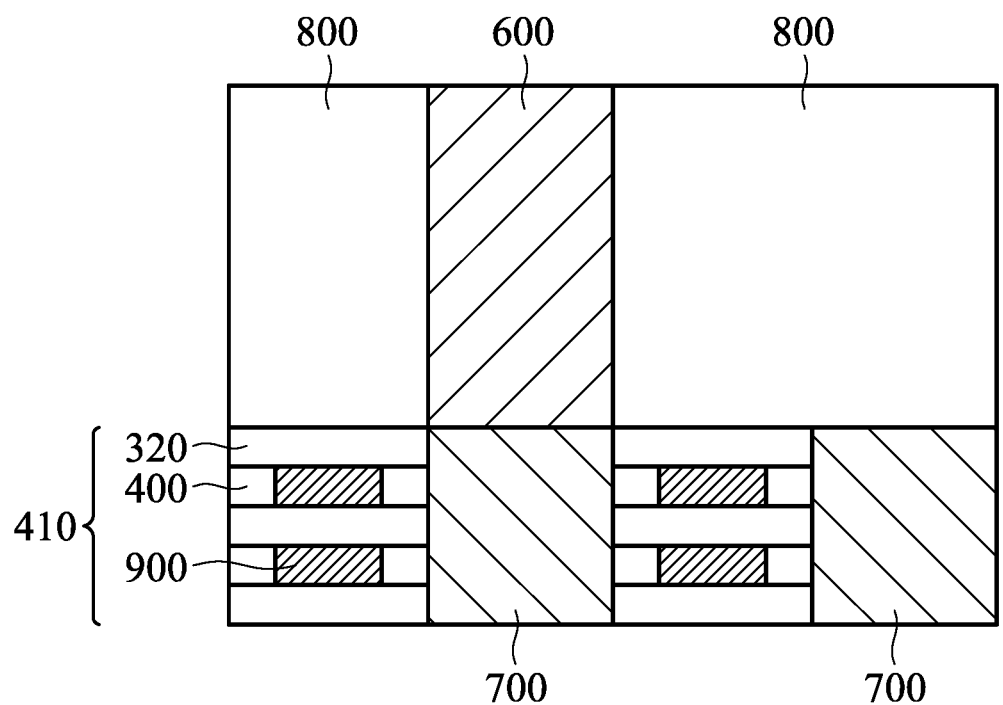

Corresponding to operation 214 of FIG. 2, FIG. 9 is a cross-sectional view of the GAA transistor device 100 where the GAA transistor device 100 is flipped and planarized to remove a portion of the semiconductor substrate 302 so as to expose the dummy semiconductor 600 (first semiconductor region) and leaving substrate regions 800 (second semiconductor region). The planarization step may be performed by anisotropic etching, or CMP, for example.

Figure 10:
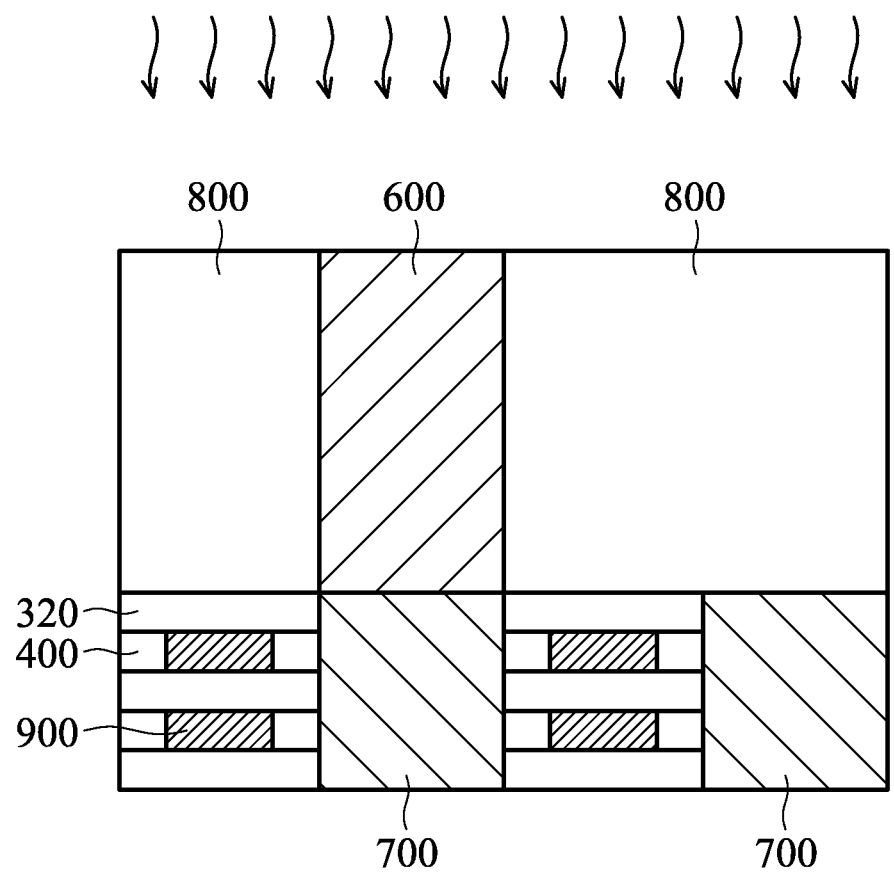

Corresponding to operation 216 of FIG. 2, FIG. 10 is a cross-sectional view of the GAA transistor device 100 where regions of the substrate regions 800 (first semiconductor region) adjacent the dummy semiconductor 600 (second semiconductor region) are implanted to form an amorphized semiconductor region of at least a portion of the first semiconductor region (regions of the semiconductor substrate 302), and a portion of the dummy semiconductor 600 (second semiconductor regions) may be implanted.

Prior to the implanting, the substrate regions 800 (first semiconductor region) may be formed of a crystalline semiconductor. The crystalline semiconductor may have a relatively low etch rate for the etchant used to etch the semiconductor substrate 302 (first semiconductor region). In some embodiments the relatively low etch rate is due to the crystallographic orientation of the semiconductor facet being etched. As one example, the silicon facet (111) has a relatively slow etch rate for alkaline solution etchants. Amorphizing the first semiconductor material of the first semiconductor region increases the etch rate of the first semiconductor material, and may further provide an increased selectivity of the first semiconductor material relative to the second semiconductor material.

According to some embodiments, an implant mask may be used to implant only the first semiconductor region but not the second semiconductor region. In other embodiments where the selectivity of the first semiconductor material relative to the second semiconductor material remains good for implanting both the first semiconductor region and the second semiconductor region, no implant mask is needed. For example, for a first semiconductor region of crystalline silicon, and a second semiconductor region of crystalline silicon-germanium, no implant mask is needed and both the first semiconductor region and the second semiconductor region are implanted.

The implantation parameters depend on the thickness and first semiconductor material of the first semiconductor region. For example, for a first semiconductor region of crystalline silicon with a thickness of 50 nm, if it is desired to remove the entire thickness by etching, Argon may be implanted in a range of about 20 to about 40 keV, and at a dose of 1E14 to 5E14 atoms/cm$^2$.

The implant may be accomplished by implanting a doping element, such as As, P or B, affecting the charge carrier density in the first semiconductor region. Alternatively, the implant may be accomplished by implanting a neutral element without affecting the charge carrier density in the first semiconductor region. Argon is one example of a neutral element.

The first semiconductor material and the second semiconductor material may be Group IV semiconductor materials, for example. The first semiconductor material may be silicon and the second semiconductor material may be silicon germanium ($Si_{1-x}Ge_x$). Ge may comprise about 15% to 35% of the semiconductor layers of $Si_{1-x}Ge_x$ in molar ratio.

In some embodiments, all of the first semiconductor region may be implanted such that the amorphized region is over the entire first semiconductor region. In some embodiments, only some of the first semiconductor region may be implanted such that the amorphized region is over only a portion of the first semiconductor region. For example, only the upper half of the first semiconductor region 800 in FIG. 10 may have an amorphized region in some embodiments.

Figure 11:
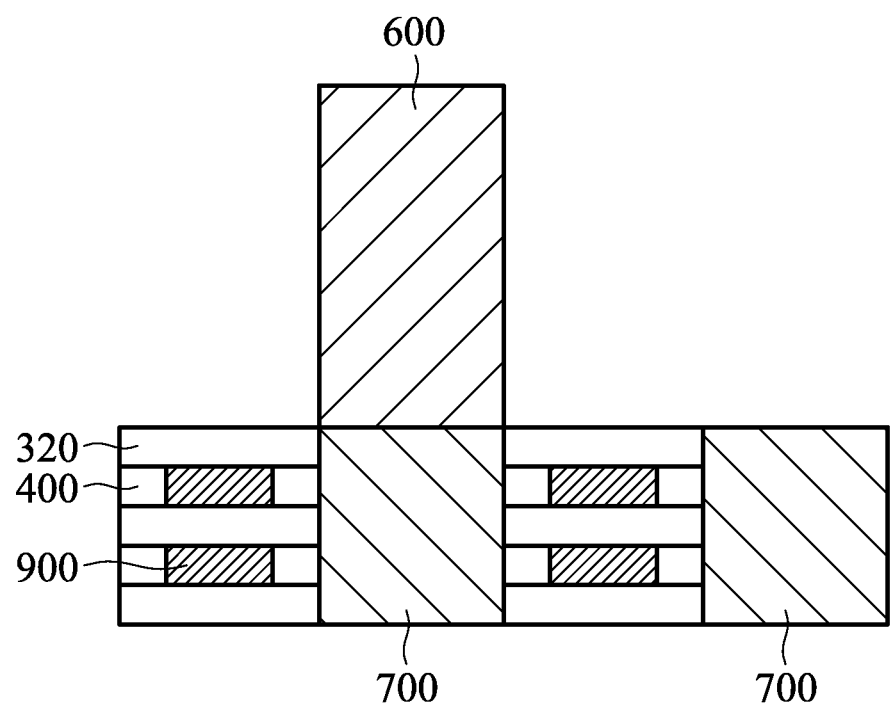

Corresponding to operation 218 of FIG. 2, FIG. 11 is a cross-sectional view of the GAA transistor device 100 where regions of the semiconductor substrate 302 (first semiconductor region) that have been implanted to form the amorphized semiconductor region are removed by etching.

For example, if the entire semiconductor substrate 302 (first semiconductor region) has been implanted to form the amorphized semiconductor region, the entire semiconductor substrate 302 is removed by etching as shown in FIG. 11.

The etchant used for removing the amorphized semiconductor region depends on the first semiconductor material. For example, if the first semiconductor material is silicon, the etchant may be an alkaline solution, such as NH$_4$OH or trimethylanilinium hydroxide. NH$_4$OH has a higher etch rate for amorphous structures than to crystalline structures.

Figure 12:
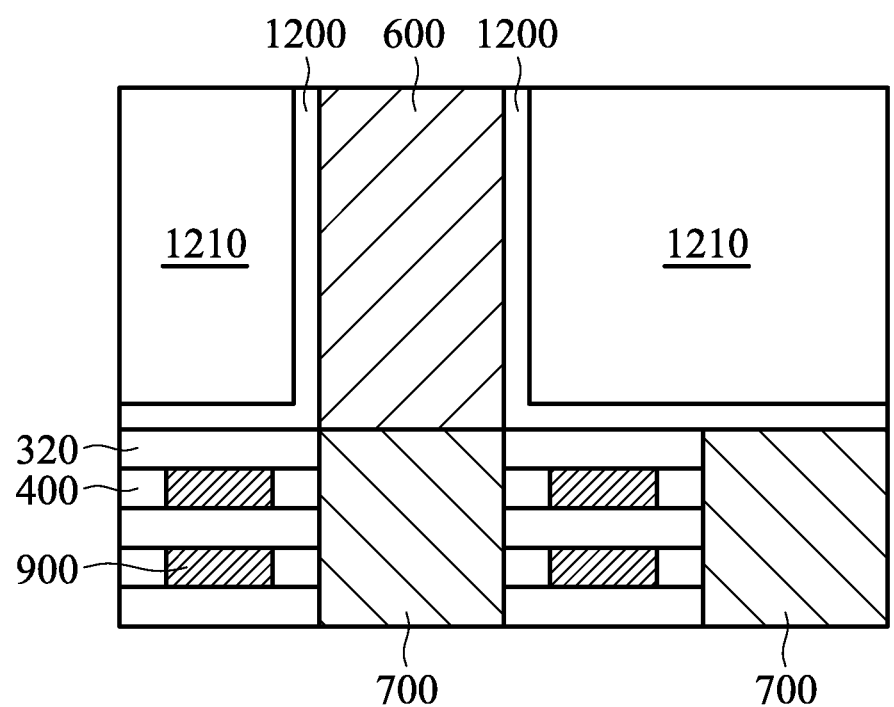

Corresponding to operation 220 of FIG. 2, FIG. 12 is a cross-sectional view of the GAA transistor device 100 where an etch stop layer 1200 is formed over the source and drain structures 700 and the gate portions 900, and is disposed adjacent the dummy semiconductor 600. The ILD 1210 is formed over a contact etch stop layer (CESL) 1200.

The CESL 1200 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 1210 is formed over the contact etch stop layer 1200. In some embodiments, the ILD 1210 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. Next, a planarization process, such as a CMP process, may be performed to achieve a level top surface for the ILD 1210.

Figure 13:
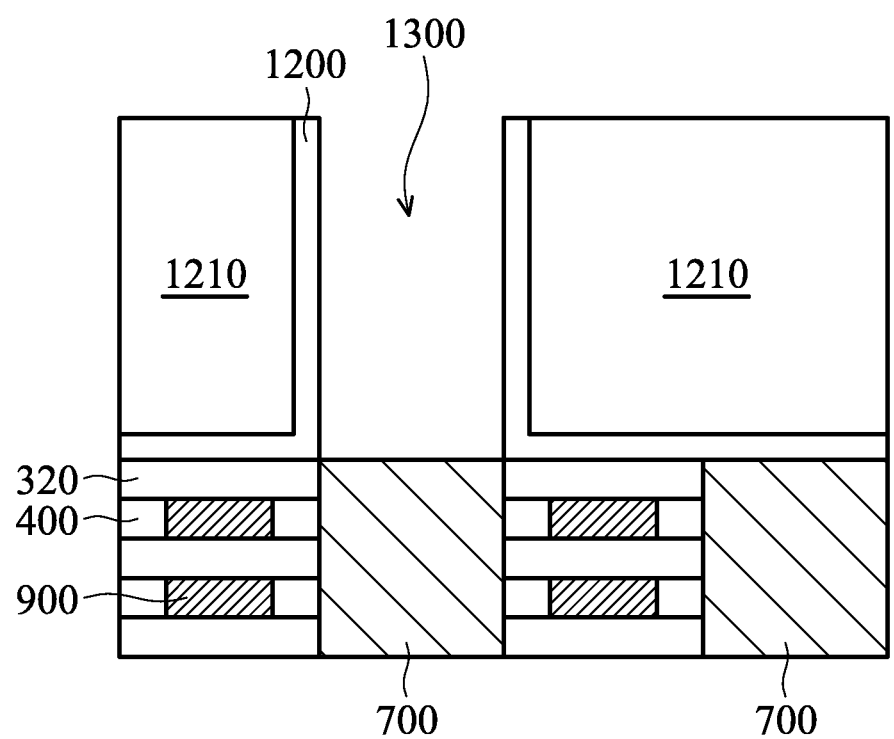

Corresponding to operation 222 of FIG. 2, FIG. 13 is a cross-sectional view of the GAA transistor device 100 where the dummy semiconductor 600 is removed. The dummy semiconductor 600 can be removed by an etching process, e.g., RIE or chemical oxide removal (COR), for example. The removal of the dummy semiconductor 600 leaves a recess 1300.

Figure 14:
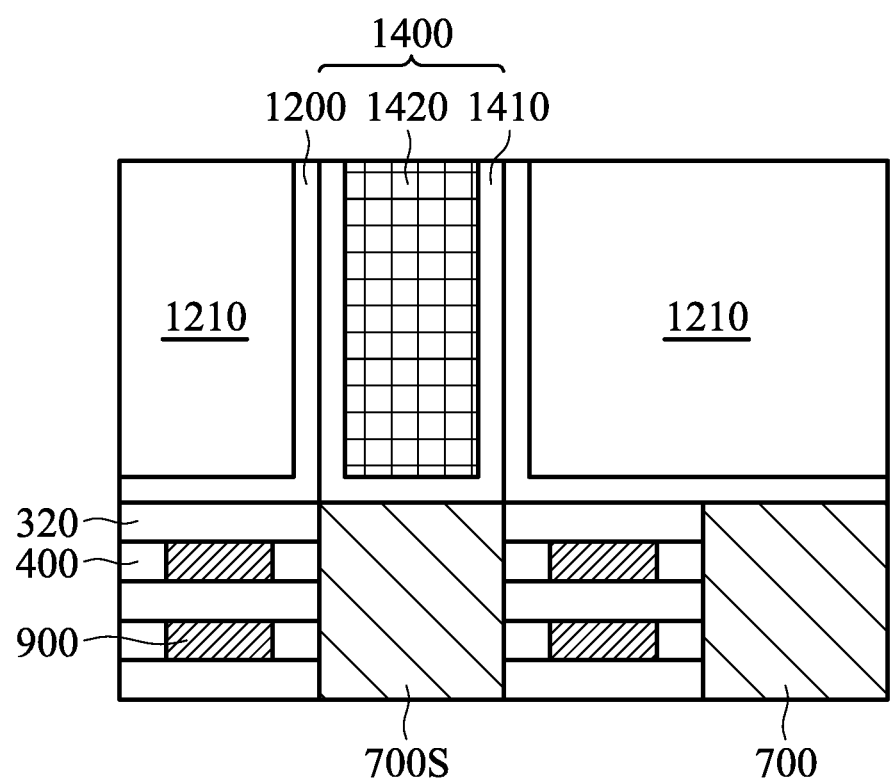

Corresponding to operation 224 of FIG. 2, FIG. 14 is a cross-sectional view of the GAA transistor device 100 where a metallization layer 1400 is formed in the recess 1300 to contact the source structure 700s, where the metallization layer 1400 includes a metal lining 1410 and a metal 1420.

The metal lining 1410 may be a barrier metal, for example. The metal lining 1410 may be formed by a suitable method, such as ALD CVD or PVD. The metal lining may be, for example, a silicide such as ZrSi$_2$, MoSi$_2$, TaSi$_2$, NiSi$_2$, or TiSi$_2$, for example.

The metal 1420 may be formed by a suitable method, such as ALD CVD or PVD. The metal 1420 may be, for example, Ru, Mo, Al, Ag, or W, for example. After the metal lining 1410 and metal 1420 are formed in the recess 1300, the metal lining 1410 and metal 1420 may be planarized to provide a level top surface of the metal lining 1410 and metal 1420. The planarization may be performed by etching or CMP, for example.

Figure 15:
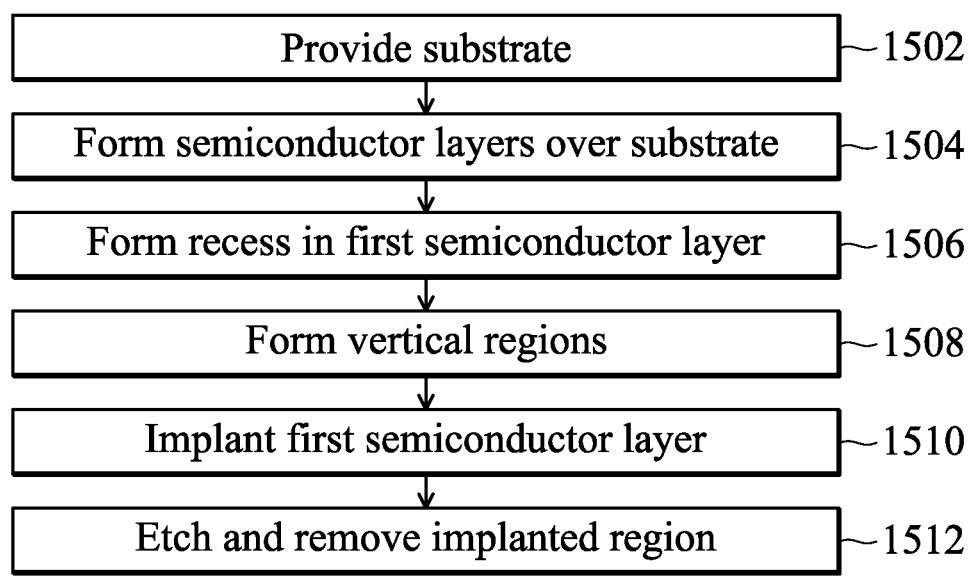
FIG. 15 illustrates a flow chart of an example method to make a semiconductor device, in accordance with some embodiments.

FIG. 15 is a flow chart illustrating steps in fabricating a semiconductor device according to some embodiments. In step 1502 a substrate is provided. Next, in step 1504 a second semiconductor layer of a second semiconductor material is formed over the substrate, and a first semiconductor layer of a first semiconductor material is formed on the second semiconductor layer. Next, in step 1506, the first semiconductor layer is patterned to form recesses in the first semiconductor layer extending to the second semiconductor layer. Next, in step 1508, the second semiconductor material is formed in the recesses to form second semiconductor vertical regions. Next, in step 1510 an implant of the first semiconductor layer is performed. Next, in step 1512 regions of the first semiconductor layer which have been amorphized by implant are etched and removed.

Figure 16:
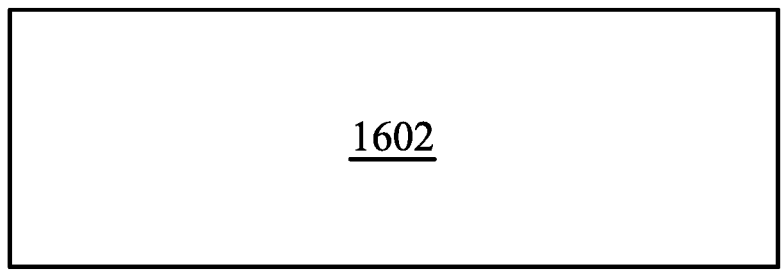
FIGS. 16-21 illustrate cross-sectional views of a semiconductor device, during various fabrication stages in accordance with some embodiments

Corresponding to operation 1502 of FIG. 15, FIG. 16 is a cross-sectional view of a semiconductor device 1600 where a substrate 1602 is provided. The substrate 1602 may be, for example, a silicon substrate, like the silicon substrate 302 of FIG. 3, for example.

Figure 17:
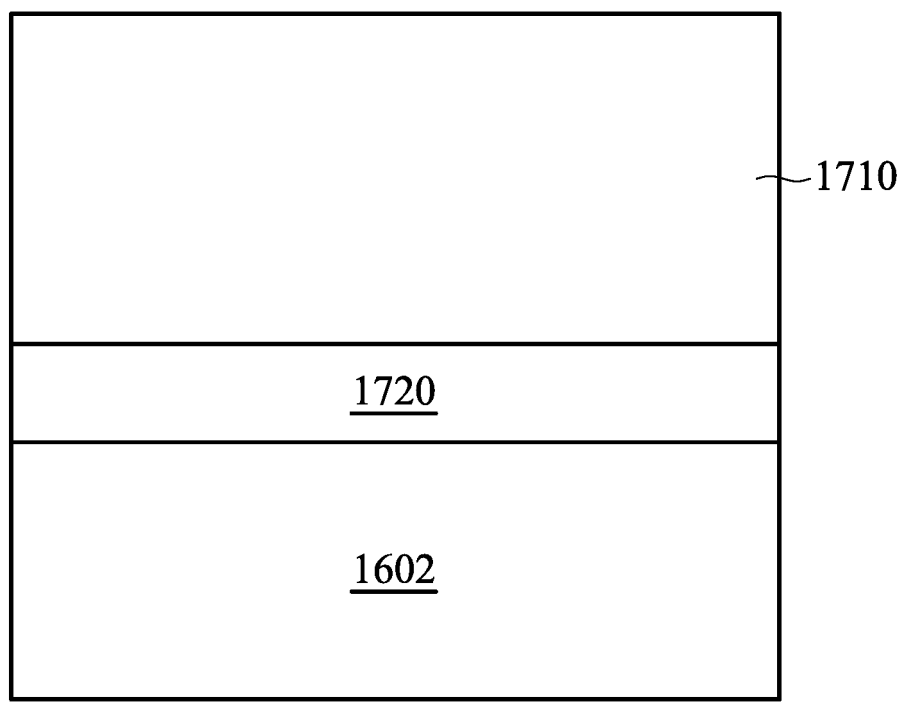

Corresponding to operation 1504 of FIG. 15, FIG. 17 is a cross-sectional view of the semiconductor device 1600 where a second semiconductor layer 1720 of a second semiconductor material is formed over the substrate 1602 and a first semiconductor layer 1710 of a first semiconductor material is formed on the second semiconductor layer 1720. The first semiconductor material is formed of a material, such that when amorphized, has an increased etch rate with an etchant used to etch the amorphized first semiconductor material. Further, as described above, when the first semiconductor material is amorphized, the selectivity of the etch of the first semiconductor material to the second semiconductor material is increased. The first and second semiconductor materials may be Group IV semiconductors. The first semiconductor material may be silicon, and the second semiconductor material may be silicon-germanium.

Figure 18:
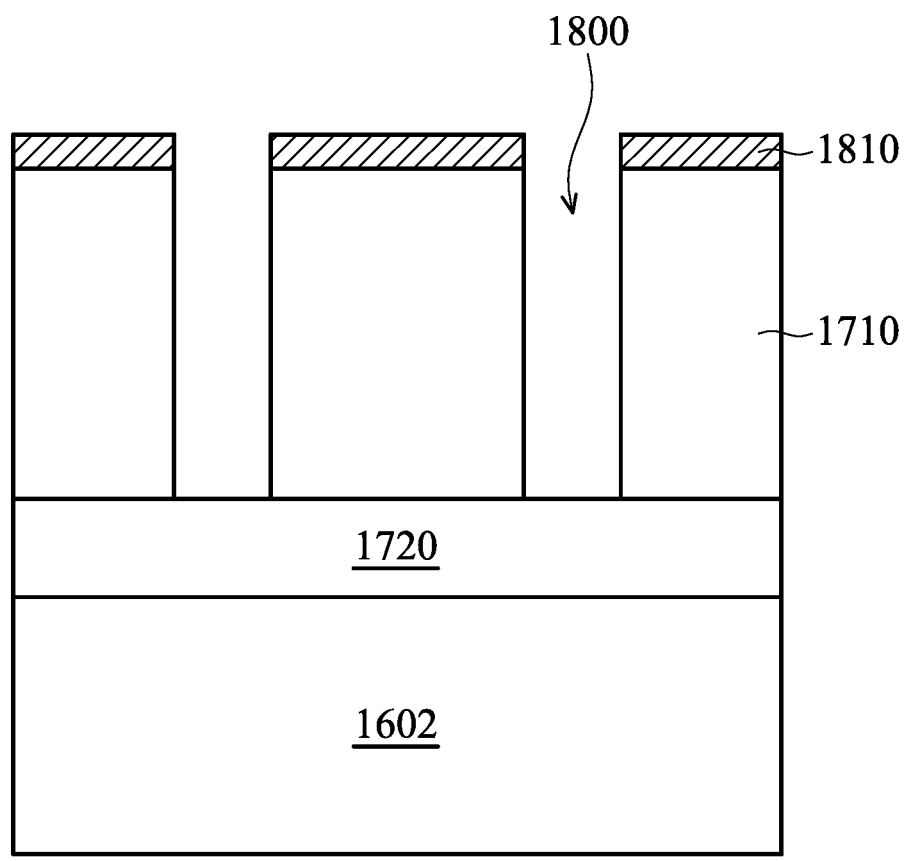

Corresponding to operation 1506 of FIG. 15, FIG. 18 is a cross-sectional view of the semiconductor device 1600 where the first semiconductor layer 1710 is patterned to form recesses 1800 in the first semiconductor layer 1710 extending to the second semiconductor layer 1720. The patterning may include, for example, forming a hard mask 1820 on the first semiconductor layer 1710. The hard mask 1820 may comprise, for example, SiN, and may be formed in a photolithographic manner. After the hard mask 1820 is formed, the first semiconductor layer 1710 may be etched using the hard mask 1820 as an etch mask to form recesses 1800. The etching may be anisotropic such as by RIE. Once the recesses 1800 are formed, the hard mask 1820 may be removed, such as by a wet etch.

Figure 19:
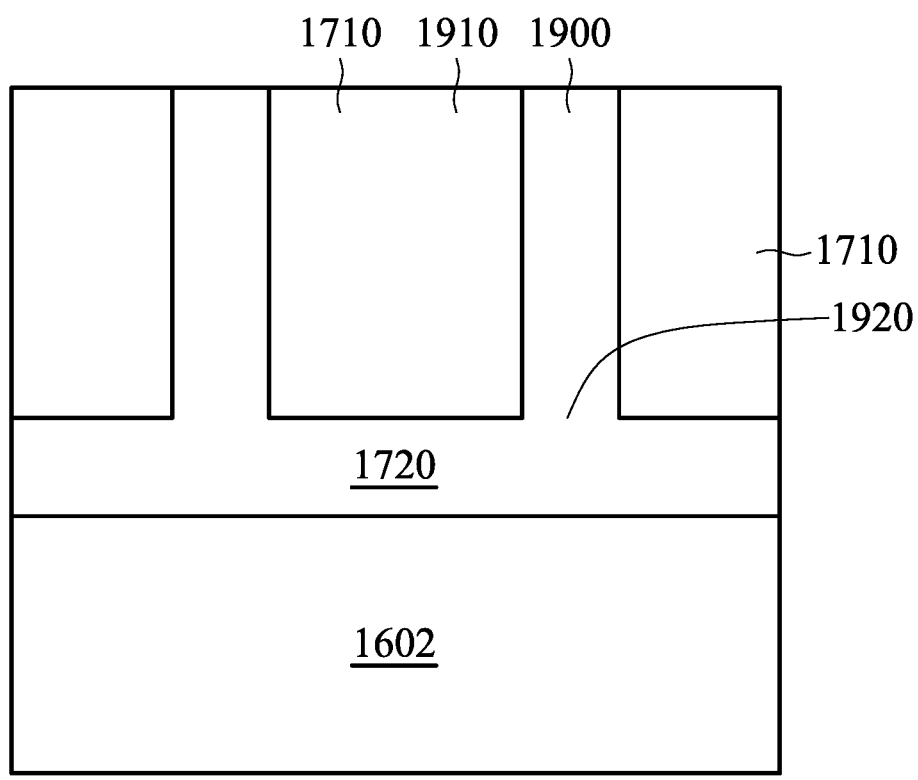

Corresponding to operation 1508 of FIG. 15, FIG. 19 is a cross-sectional view of the semiconductor device 1600 where the second semiconductor material is formed in the recesses 1800 to form second semiconductor vertical regions 1900. The second semiconductor vertical regions 1900 may be epitaxially grown from the second semiconductor 1720, for example, to fill the recesses 1800. Alternatively, the second semiconductor vertical regions 1900 may be deposited in the recesses 1800.

The second semiconductor vertical region 1900 and the second semiconductor layer 1720 together form second semiconductor region 1920, while the first semiconductor layer 1710 forms first semiconductor region 1910. According to some embodiments, the semiconductor device 1600 does not include the second semiconductor layer 1720, but only the second semiconductor vertical region 1900. In this case, the second semiconductor vertical region 1900 may extend to the semiconductor substrate 1602.

Figure 20:
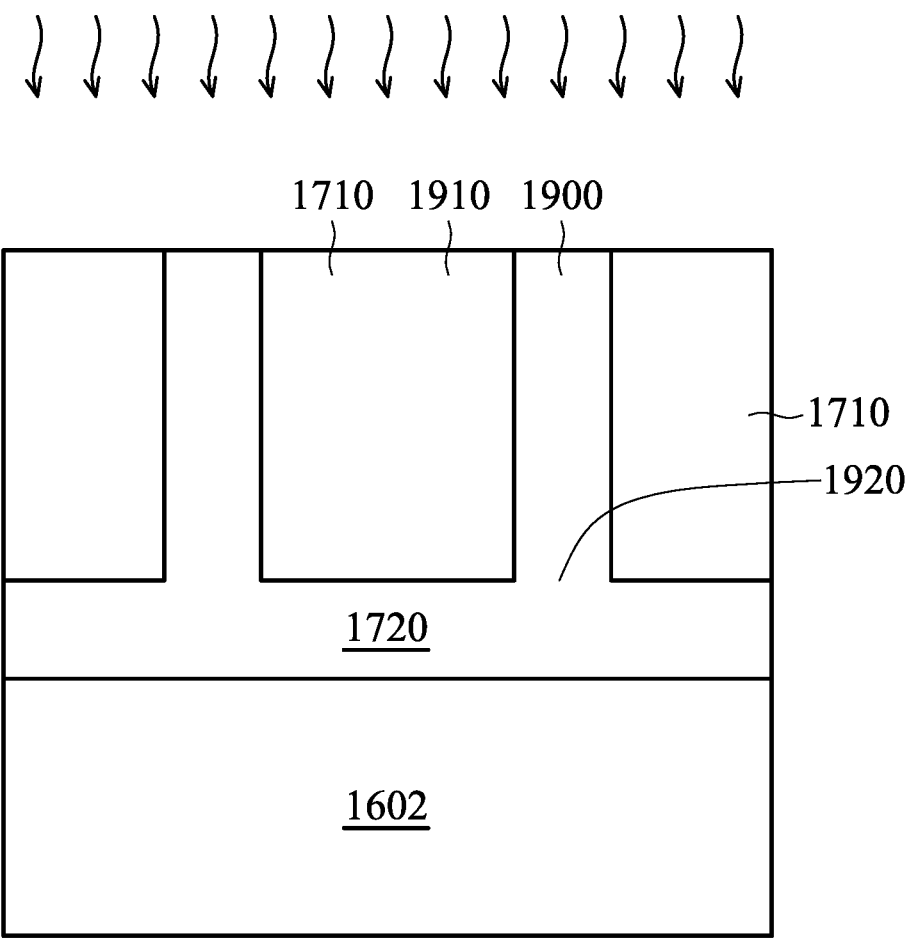

Corresponding to operation 1510 of FIG. 15, FIG. 20 shows an implant of the first semiconductor layer 1710 of the first semiconductor region 1910. Prior to the implant, the first semiconductor region 1910 may be a crystalline semiconductor. The crystalline semiconductor may have a relatively low etch rate for the etchant used to etch the first semiconductor region 1910. In some embodiments the relatively low etch rate is due to the crystallographic orientation of the semiconductor facet being etched. As one example, the silicon facet (111) has a relatively low etch rate for alkaline solution etchants. Amorphizing the first semiconductor material of the first semiconductor region 1910 increases the etch rate of the first semiconductor material, and may further provide an increased selectivity of the first semiconductor material relative to the second semiconductor material.

According to some embodiments, an implant mask may be used to implant only the first semiconductor region 1910, but not the second semiconductor region 1920. In other embodiments where the selectivity of the first semiconductor material relative to the second semiconductor material remains good for implanting both the first semiconductor region 1910 and the second semiconductor region 1920, no implant mask is needed. For example, for a first semiconductor region 1910 of crystalline silicon, and a second semiconductor region 1920 of crystalline silicon-germanium, no implant mask is needed and both the first semiconductor region 1910 and the second semiconductor region 1920 are implanted.

The implantation parameters depend on the thickness and first semiconductor material of the first semiconductor region 1910. For example, for a first semiconductor region 1910 of crystalline silicon with a thickness of 50 nm, if it is desired to remove the entire thickness by etching, Argon may be implanted in a range of about 20 to about 40 keV, and a dose of about 1E14 to about 5E14 atoms/cm$^2$.

The implant may be accomplished by implanting a doping element affecting the charge carrier density in the first semiconductor region 1910. Alternatively, the implant may be accomplished by implanting a neutral element without affecting the charge carrier density in the first semiconductor region 1910. Argon is one example of a neutral element.

The first semiconductor material and the second semiconductor material may be Group IV semiconductor materials, for example. The first semiconductor material may be silicon and the second semiconductor material may be silicon germanium.

In some embodiments, all of the first semiconductor region 1910 may be implanted such that the amorphized region is over the entire first semiconductor region 1910. In some embodiments, only some of the first semiconductor region 1910 may be implanted such that the amorphized region is over only a portion of the first semiconductor region 1910.

Figure 21:
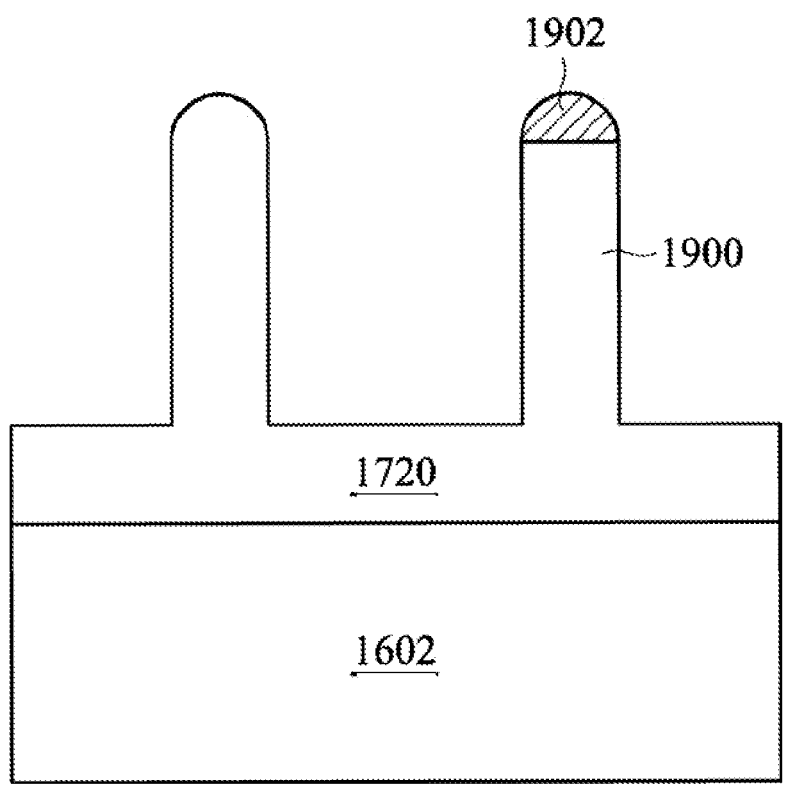

Corresponding to operation 1512 of FIG. 15, FIG. 21 shows an etch of an amorphized portion of the first semiconductor region 1910 to remove the amorphized portion.

For example, if the entire first semiconductor region 1910 has been implanted to form the amorphized semiconductor region, the entire first semiconductor region 1910 is removed by etching as shown in FIG. 21.

The etchant used for removing the amorphized semiconductor region depends on the first semiconductor material. For example, if the first semiconductor material is silicon, the etchant may be an alkaline solution, such as NH$_4$OH or trimethylanilinium hydroxide. The second semiconductor vertical region 1900 may be slightly rounded at a top due to the etch. Ar may be present at the top 1902 of the second semiconductor vertical region 1900.

In one aspect of the present disclosure, a method of fabricating a semiconductor device is disclosed. A substrate is provided. A first semiconductor region of a first semiconductor material is formed over the substrate adjacent a second semiconductor region of a second semiconductor material. The first and second semiconductor regions are crystalline. An etchant is selective to etch the first semiconductor region over the second semiconductor region. The first semiconductor region is implanted to form an amorphized semiconductor region. The amorphized semiconductor region is etched with the etchant to remove the amorphized semiconductor region.

In another aspect of the present disclosure, a method of fabricating a semiconductor device is disclosed. A substrate is provided. A first semiconductor region of a first semiconductor material is formed over the substrate and adjacent a second semiconductor region of a second semiconductor material. The first and second semiconductor regions are crystalline. An etchant is selective to etch the first semiconductor region over the second semiconductor region. The entire first semiconductor region is implanted to form an amorphized semiconductor region. The amorphized semiconductor region is etched with the etchant using the second semiconductor region as a mask to remove the amorphized semiconductor region without removing the second semiconductor region.

In another aspect of the present disclosure, a semiconductor device is disclosed. A substrate is provided. A semiconductor layer is disposed above the substrate and comprises a Group IV semiconductor material. The semiconductor layer includes a horizontal region extending in a horizontal direction and a vertical region extending in a vertical direction from the horizontal region and contacting the horizontal region. The vertical region has a top which is rounded. The vertical region includes argon at the top.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
  a substrate including a first semiconductor material; and
  a semiconductor structure disposed over the substrate, wherein:
    the semiconductor structure includes a second semiconductor material different from the first semiconductor material,
    the semiconductor structure includes a first portion directly contacting and laterally extending across a top surface of the substrate and a second portion connected to and vertically protruding from the first portion, and
    a composition of the second portion varies from a top region to a bottom region of the second portion.

2. The semiconductor device of claim 1, wherein the first and second semiconductor materials are group IV semiconductor materials.

3. The semiconductor device of claim 2, wherein the first semiconductor material is silicon.

4. The semiconductor device of claim 3, wherein the second semiconductor material is silicon-germanium.

5. The semiconductor device of claim 1, wherein the second portion is epitaxially grown from the first portion.

6. The semiconductor device of claim 1, wherein the top region of the second portion has a rounded top surface.

7. The semiconductor device of claim 1, wherein the top region includes a neutral element.

8. The semiconductor device of claim 7, wherein the neutral element is argon.

9. The semiconductor device of claim 7, and wherein the bottom region is free of the neutral element.

10. The semiconductor device of claim 1, wherein the semiconductor structure further includes:
    a third portion protruding vertically from the first portion and parallel to the second portion, and
    a recess laterally interposed between the second portion and the third portion.

11. The semiconductor device of claim 10, wherein the first portion extends continuously between the second portion and the third portion.

12. A semiconductor device, comprising:
    a substrate including a first semiconductor material; and
    a semiconductor disposed over the substrate, wherein:
        the semiconductor structure includes a second semiconductor material different from the first semiconductor material, the second semiconductor material being crystalline and including germanium,
        the semiconductor structure includes a first portion directly contacting and extending laterally across a top surface of the substrate and a second portion extending vertically from the first portion, and
        the second portion includes a top region having a neutral element.

13. The semiconductor device of claim 12, wherein the first semiconductor material is silicon and the second semiconductor material is silicon-germanium.

14. The semiconductor device of claim 12, wherein the semiconductor structure further includes:
    a third portion protruding vertically from the first portion and parallel to the second portion, and
    a recess laterally interposed between the second portion and the third portion.

15. The semiconductor device of claim 14, wherein the first portion extends continuously between the second portion and the third portion.

16. The semiconductor device of claim 12, wherein the top region has a rounded profile.

17. The semiconductor device of claim 12, wherein the neutral element is argon.

18. A semiconductor device, comprising:
    a substrate including a first semiconductor material free of germanium; and
    a semiconductor disposed over the substrate, wherein:
        the semiconductor structure includes a second semiconductor material, the second semiconductor including germanium,
        the semiconductor structure includes a lateral portion directly contacting a top surface of the substrate and a vertical portion protruding from the lateral portion, and
        a composition of the vertical portion of the semiconductor structure varies from a top region to a bottom region of the vertical portion.

19. The semiconductor device of claim 18, wherein the top region includes argon, and wherein the bottom region is free of argon.

20. The semiconductor device of claim 19, wherein the top region has a rounded profile.

* * * * *